(12) United States Patent
Kusumoto et al.

(10) Patent No.: US 11,075,274 B2
(45) Date of Patent: Jul. 27, 2021

(54) CONDUCTIVE LINE CONSTRUCTION, MEMORY CIRCUITRY, AND METHOD OF FORMING A CONDUCTIVE LINE CONSTRUCTION

(71) Applicant: Micron Technology, Inc., Boise, ID (US)

(72) Inventors: Kenichi Kusumoto, Hiroshima (JP); Yasutaka Iuchi, Hiroshima (JP); Akie Shimamura, Hiroshima (JP)

(73) Assignee: Micron Technology, Inc., Boise, ID (US)

( * ) Notice: Subject to any disclaimer, the term of this patent is extended or adjusted under 35 U.S.C. 154(b) by 19 days.

(21) Appl. No.: 16/251,307

(22) Filed: Jan. 18, 2019

(65) Prior Publication Data

US 2020/0235219 A1 Jul. 23, 2020

(51) Int. Cl.
*H01L 29/49* (2006.01)
*H01L 21/28* (2006.01)
*H01L 29/423* (2006.01)

(52) U.S. Cl.
CPC .... *H01L 29/4941* (2013.01); *H01L 21/28061* (2013.01); *H01L 29/42372* (2013.01)

(58) Field of Classification Search
CPC combination set(s) only.
See application file for complete search history.

(56) References Cited

U.S. PATENT DOCUMENTS

| 7,902,614 | B2 | 3/2011 | Lim et al. |
| 8,008,178 | B2 | 8/2011 | Lim et al. |
| 8,441,079 | B2 | 5/2013 | Lim et al. |
| 9,064,854 | B2 | 6/2015 | Lim et al. |

(Continued)

FOREIGN PATENT DOCUMENTS

| KR | 10-2006-0075384 | 7/2006 |
| KR | 10-2008-0061224 | 7/2008 |

(Continued)

*Primary Examiner* — Ratisha Mehta
(74) *Attorney, Agent, or Firm* — Wells St. John P.S.

(57) ABSTRACT

A method of forming a conductive line construction comprises forming a structure comprising polysilicon-comprising material. Elemental titanium is directly against the polysilicon of the polysilicon-comprising material. Silicon nitride is directly against the elemental titanium. Elemental tungsten is directly against the silicon nitride. The structure is annealed to form a conductive line construction comprising the polysilicon-comprising material, titanium silicide directly against the polysilicon-comprising material, elemental tungsten, $TiSi_xN_y$ between the elemental tungsten and the titanium silicide, and one of (a) or (b), with (a) being the $TiSi_xN_y$ is directly against the titanium silicide, and (b) being titanium nitride is between the $TiSi_xN_y$ and the titanium silicide, with the $TiSi_xN_y$ being directly against the titanium nitride and the titanium nitride being directly against the titanium silicide. Structure independent of method is disclosed.

19 Claims, 3 Drawing Sheets

(56) References Cited

U.S. PATENT DOCUMENTS

| | | | | |
|---|---|---|---|---|
| 2013/0056823 A1* | 3/2013 | Kim | ............... | H01L 27/10894 257/334 |
| 2013/0241011 A1* | 9/2013 | Lim | ............... | H01L 29/513 257/412 |
| 2016/0351491 A1* | 12/2016 | Lee | ............... | H01L 23/53271 |
| 2016/0380090 A1* | 12/2016 | Roberts | ............... | H01L 29/402 257/76 |
| 2020/0098657 A1* | 3/2020 | Sen Gupta | ............... | H01L 27/2463 |

FOREIGN PATENT DOCUMENTS

| | | |
|---|---|---|
| KR | 10-2010-0130399 | 12/2010 |
| WO | PCT/US2019/061951 | 3/2020 |

* cited by examiner

CONDUCTIVE LINE CONSTRUCTION, MEMORY CIRCUITRY, AND METHOD OF FORMING A CONDUCTIVE LINE CONSTRUCTION

TECHNICAL FIELD

Embodiments disclosed herein pertain to conductive line constructions, to memory circuitry, and to methods of forming a conductive line construction.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The digitlines may conductively interconnect memory cells along columns of the array, and the access lines may conductively interconnect memory cells along rows of the array. Each memory cell may be uniquely addressed through the combination of a digitline and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1. In other systems, at least some individual memory cells may be configured to store more than two levels or states of information.

A capacitor is one type of electronic component that may be used in a memory cell. A capacitor has two electrical conductors separated by electrically insulating material. Energy as an electric field may be electrostatically stored within such material. Depending on composition of the insulator material, that stored field will be volatile or non-volatile. For example, a capacitor insulator material including only $SiO_2$ will be volatile. One type of non-volatile capacitor is a ferroelectric capacitor which has ferroelectric material as at least part of the insulating material. Ferroelectric materials are characterized by having two stable polarized states and thereby can comprise programmable material of a capacitor and/or memory cell. The polarization state of the ferroelectric material can be changed by application of suitable programming voltages and remains after removal of the programming voltage (at least for a time). Each polarization state has a different charge-stored capacitance from the other, and which ideally can be used to write (i.e., store) and read a memory state without reversing the polarization state until such is desired to be reversed. Less desirable, in some memory having ferroelectric capacitors the act of reading the memory state can reverse the polarization. Accordingly, upon determining the polarization state, a re-write of the memory cell is conducted to put the memory cell into the pre-read state immediately after its determination. Regardless, a memory cell incorporating a ferroelectric capacitor ideally is non-volatile due to the bi-stable characteristics of the ferroelectric material that forms a part of the capacitor. Other programmable materials may be used as a capacitor insulator to render capacitors non-volatile.

A field effect transistor is another type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate. Regardless, the gate insulator may be programmable, for example being ferroelectric.

Digitlines and wordlines are conductive line constructions that may comprise multiple different conductive materials. One or more of the conductive materials may in part function as a diffusion barrier to preclude or at least restrict immediately adjacent materials thereto from diffusing relative to one another. In some constructions, an outermost material comprises elemental tungsten or other metal. Ideally, such are deposited in a desired crystalline phase.

Conductive line constructions are of course used in other integrated circuitry.

DETAILED DESCRIPTION OF EXAMPLE EMBODIMENTS

Embodiments of the invention encompass methods of forming a conductive line construction as well as a conductive line construction independent of method of manufacture. Embodiments of the invention also encompass memory circuitry. First example embodiments are described with reference to FIGS. 1-5.

Figure 1:
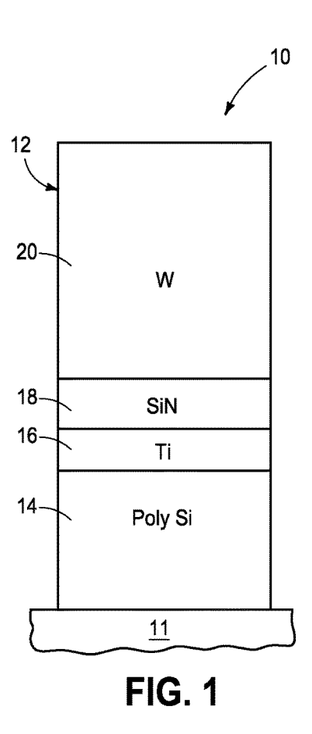
FIG. 1 is a diagrammatic cross-sectional view of a portion of a conductive line construction in process in accordance with an embodiment of the invention.

Referring to FIG. 1, a conductive line construction 10 in process in accordance with a method embodiment comprises a structure 12 having been fabricated relative to a base substrate 11. Substrate 11 may comprise any of conductive/conductor/conducting, semiconductive/semiconductor/semiconducting, and insulative/insulator/insulating (i.e., electrically herein) materials. Various materials are above base substrate 11. Materials may be aside, elevationally inward, or elevationally outward of the FIG. 1-depicted materials. For example, other partially or wholly fabricated components of integrated circuitry may be provided somewhere above, about, or within base substrate 11. Control and/or other peripheral circuitry for operating components within a memory or other array of electronic components may also be fabricated and may or may not be wholly or partially within an array or sub-array. Further, multiple sub-arrays may also be fabricated and operated independently, in tandem, or otherwise relative one another. As used in this document, a "sub-array" may also be considered as an array.

Example structure 12 is shown as a vertical stack of several materials that have been collectively patterned relative to substrate 11, for example to form a longitudinally-elongated horizontal line running into and out of the plane of page upon which FIG. 1 lies. Alternately, and by way of example only, one or more of the materials of structure 12 may be patterned separately relative to one another. Further, the various materials of a conductive line construction may be laterally and/or diagonally adjacent one another and the line construction may be other than horizontally oriented, such as vertically, diagonally, etc. oriented, including combinations thereof. Example structure 12 has been formed to comprise polysilicon-comprising material 14, elemental titanium 16 directly against polysilicon of polysilicon-comprising material 14, silicon nitride 18 directly against elemental titanium 16, and elemental tungsten 20 directly against silicon nitride 18. Materials 14, 16, 18, and 20 may be of any suitable thicknesses, with an example thickness for polysilicon-comprising material 14 being from 25 to 200 Angstroms, for elemental titanium 16 being from 15 to 30 Angstroms, for silicon nitride 18 being from 25 to 40 Angstroms, and for elemental tungsten 20 being from 50 to 500 Angstroms.

In one embodiment, each of elemental titanium 16, silicon nitride 18, and elemental tungsten 20 is formed over substrate 11/14 in sub-atmospheric conditions (e.g., below 100 mTorr), with the substrate being kept at sub-atmospheric conditions at all times between forming all of elemental titanium 16 and forming all of elemental tungsten 20. Such may occur, for example, by physical vapor deposition of one or more of materials 14, 16, 18, and 20 in one or more chambers where the substrate is kept under vacuum and not exposed to atmospheric conditions in movement from one chamber to another. By such physical vapor deposition, silicon nitride 18 may be formed as amorphous silicon nitride. In some examples, materials 14, 16, 18 and 20 may be used as a gate electrode of a transistor, and that may be formed on gate dielectric material (not shown) that is above substrate 11.

Figure 2:
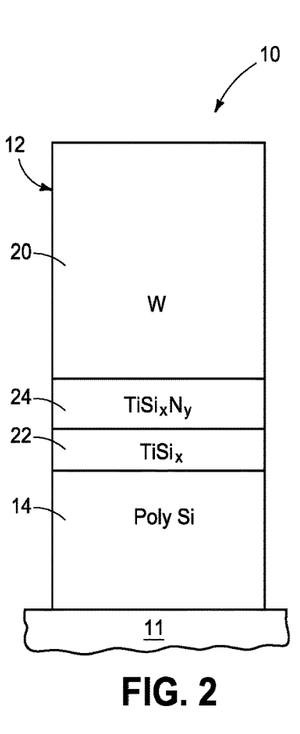
FIG. 2 is a view of the FIG. 1 substrate at a processing step subsequent to that shown by FIG. 1.

Referring to FIG. 2, structure 12 has been annealed to form conductive line construction 10 to comprise polysilicon-comprising material 14, titanium silicide 22 directly against polysilicon-comprising material 14, elemental tungsten 20, and $TiSi_xN_y$ 24 between elemental tungsten 20 and titanium silicide 22, with $TiSi_xN_y$ 24 being directly against titanium silicide 22, and in one embodiment with $TiSi_xN_y$ 24 being directly against elemental tungsten 20. In one embodiment, the annealing comprises a temperature of at least 800° C. In one embodiment, silicon nitride 18 is formed to be amorphous and in one embodiment the forming of all of silicon nitride 18 occurs at a temperature of no greater than 350° C. Such may facilitate preclusion of all of the silicon nitride from reacting with the elemental titanium to form titanium nitride and titanium silicide therefrom without forming any $TiSi_xN_y$. Such may also facilitate growth of larger grains in elemental tungsten 20 and thereby reduced-resistance/increased-conductively thereof. In one embodiment, the gate electrode of a transistor on gate dielectric material may be thus made by including polysilicon material 14, titanium silicide ($TiSi_x$) 22, $TiSi_xN_y$ 24, and elemental tungsten 20. Any other attribute(s) or aspect(s) as shown and/or described herein with respect to other embodiments may be used.

Figure 3:
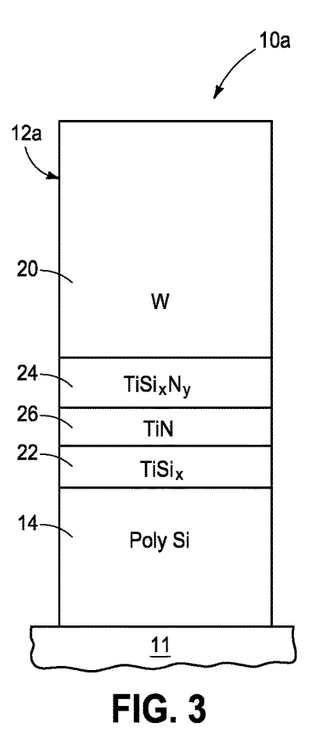
FIG. 3 is a view of the FIG. 1 substrate at a processing step subsequent to that shown by FIG. 1 and is an alternate to that shown by FIG. 2.

FIG. 3 shows an example alternate embodiment wherein the annealing has formed a conductive line construction 10a. Like numerals from the above-described embodiments have been used where appropriate, with some construction differences being indicated with the suffix "a" or with different numerals. The annealing has formed structure 12a to comprise titanium nitride 26 between $TiSi_xN_y$ 24 and titanium silicide 16, with $TiSi_xN_y$ 24 being directly against titanium nitride 26 and titanium nitride 26 being directly against titanium silicide 22. The overall collective thickness of materials 22, 26 and 24 in FIG. 3 may be of the same collective thickness as materials 22 and 24 in FIG. 2 (not shown). Further and regardless, any patterning that may occur to form conductive line construction 10/10a may occur before or after the annealing. In one embodiment, the gate electrode of a transistor on gate dielectric material may be thus made by including polysilicon material 14, titanium silicide ($TiSi_x$) 22, titanium nitride 26, $TiSi_xN_y$ 24, and elemental tungsten 20. Any other attribute(s) or aspect(s) as shown and/or described herein with respect to other embodiments may be used.

Figure 4:
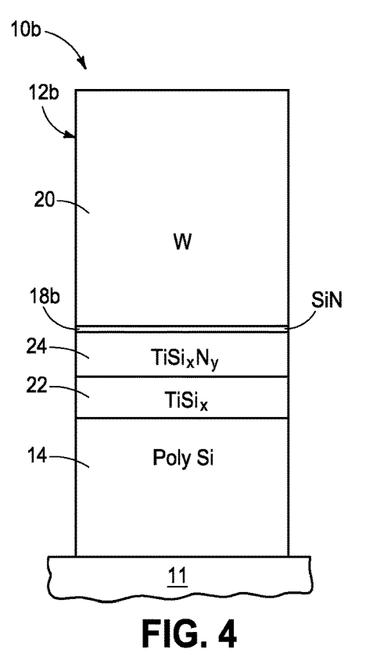
FIG. 4 is a view of the FIG. 1 substrate at a processing step subsequent to that shown by FIG. 1 and is an alternate to those shown by FIGS. 2 and 3.

An alternate example embodiment conductive line construction 10b resulting from the annealing is shown and described with reference to FIG. 4. Like numerals from the above-described embodiments have been used where appropriate, with some construction differences being indicated with the suffix "b". Conductive line construction 10b of FIG. 4 is analogous to conductive line construction 10 of FIG. 2, however wherein the annealing leaves silicon nitride 18b at a thickness of no more than 10 Angstroms between $TiSi_xN_y$ 24 and elemental tungsten 20. $TiSi_xN_y$ 24 is directly against silicon nitride 18b and elemental tungsten 20 is directly against silicon nitride 18b. Silicon nitride 18b is sufficiently thin (i.e., no greater than 10 Angstroms thick) wherein conductive line construction 10b is conductive from its top to bottom in spite of silicon nitride material 18b being intrinsically insulative. In one embodiment, the gate electrode of a transistor on gate dielectric material may be thus made by including polysilicon material 14, titanium silicide ($TiSi_x$) 22, $TiSi_xN_y$ 24, silicon nitride 18b, and elemental tungsten 20. Any other attribute(s) or aspect(s) as shown and/or described herein with respect to other embodiments may be used.

Figure 5:
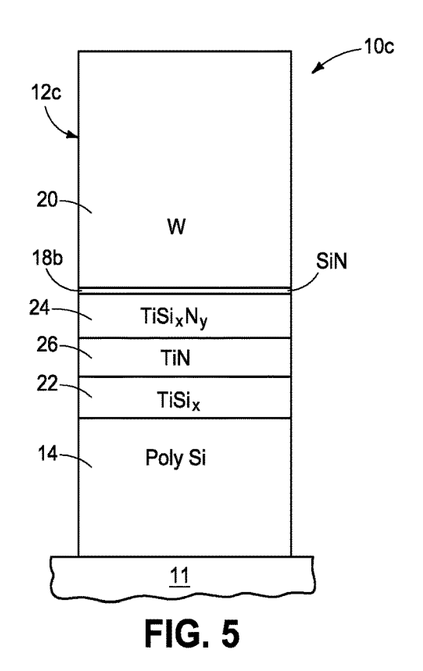
FIG. 5 is a view of the FIG. 1 substrate at a processing step subsequent to that shown by FIG. 1 and is an alternate to those shown by FIGS. 2-4.

FIG. 5 shows an alternate embodiment conductive line construction analogous to that of construction 10a of FIG. 3, however wherein the annealing leaves silicon nitride 18b at a thickness of no more than 10 Angstroms between $TiSi_xN_y$ 24 and elemental tungsten 20. Like numerals from the above-described embodiments have been used where appropriate, with some construction differences being indicated with the suffix "c". In one embodiment, the gate electrode of a transistor on gate dielectric material may be thus made by including polysilicon material 14, titanium silicide (TiSi$_x$) 22, titanium nitride 26, TiSi$_x$N$_y$ 24, silicon nitride 18b, and elemental tungsten 20. Any other attribute(s) or aspect(s) as shown and/or described herein with respect to other embodiments may be used.

Figure 6:
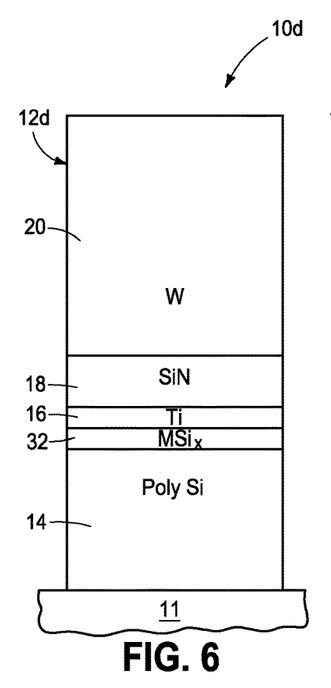
FIG. 6 is a diagrammatic cross-sectional view of a portion of a conductive line construction in process in accordance with an embodiment of the invention.

Alternate example methods of forming a conductive line construction are next described with reference to FIGS. 6-10. Like numerals from the above-described embodiments have been used where appropriate, with some construction differences being indicated with the suffix "d" or with different numerals. Referring to FIG. 6, such shows a conductive line construction 10d in fabrication. Such shows the forming of a structure 12d comprising polysilicon-comprising material 14, metal silicide 32 directly against polysilicon of polysilicon-comprising material 14, elemental titanium 16 directly against metal silicide MSi$_x$ of material 32, silicon nitride 18 directly against elemental titanium 16, and elemental tungsten 20 directly against silicon nitride 18. An example metal in metal silicide MSi$_x$ of material 32 is one or more of nickel, magnesium, platinum, tantalum, cobalt, tungsten, and molybdenum. Material 32 may be of any suitable thickness, with 15 Angstroms to 30 Angstroms being an example. Ideally, metal silicide MSi$_x$ of material 32 is formed on the polysilicon-comprising material 14 before depositing elemental titanium 16, silicon nitride 18, and elemental tungsten 20.

Figure 7:
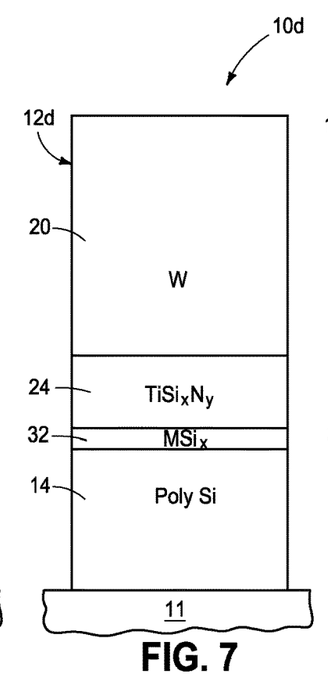
FIG. 7 is a view of the FIG. 6 substrate at a processing step subsequent to that shown by FIG. 6.

Referring to FIG. 7, structure 12d has been annealed to form conductive line construction 10d. A reaction between titanium 16 and the metal silicide 32 does not occur, whereas a reaction between titanium 16 and silicon nitride 18 does occur. Annealed structure 12d thus comprises elemental tungsten 20 and TiSi$_x$N$_y$ 24 between elemental tungsten 20 and metal silicide 32, with TiSi$_x$N$_y$ 24 being directly against metal silicide 32. In one embodiment, metal silicide 32 comprises at least one of nickel silicide, magnesium silicide, platinum silicide, tantalum silicide, cobalt silicide, tungsten silicide, and molybdenum silicide. In one embodiment, metal silicide 32 comprises at least two of nickel silicide, magnesium silicide, platinum silicide, tantalum silicide, cobalt silicide, tungsten silicide, and molybdenum silicide. In one embodiment and as shown, the annealing forms TiSi$_x$N$_y$ 24 directly against elemental tungsten 20. Any other attribute(s) or aspect(s) as shown and/or described herein with respect to other embodiments may be used.

Figure 8:
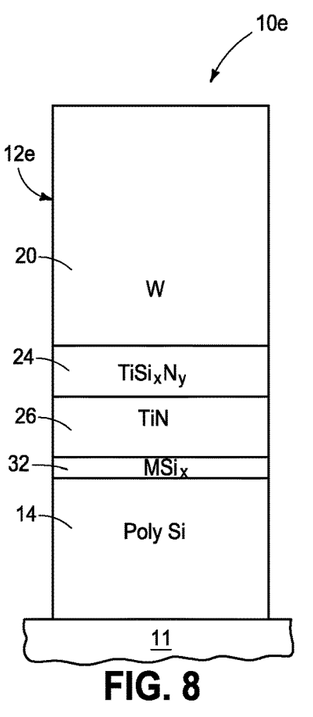
FIG. 8 is a view of the FIG. 6 substrate at a processing step subsequent to that shown by FIG. 6 and is an alternate to that shown by FIG. 7.

FIG. 8 shows an alternate example conductive line construction 10e wherein the annealing has formed titanium nitride 26 between TiSi$_x$N$_y$ 24 and metal silicide 32, with TiSi$_x$N$_y$ 24 being directly against titanium nitride 26 and titanium nitride 26 being directly against metal silicide 32. Like numerals from the above-described embodiments have been used where appropriate, with some construction differences being indicated with the suffix "e". Any other attribute(s) or aspect(s) as shown and/or described herein with respect to other embodiments may be used.

Figure 9:
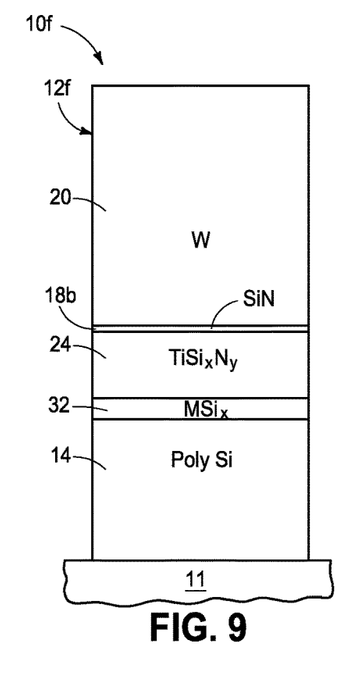
FIG. 9 is a view of the FIG. 6 substrate at a processing step subsequent to that shown by FIG. 6 and is an alternate to those shown by FIGS. 7 and 8.

An alternate example conductive line construction 10f is shown in FIG. 9. Like numerals from the above-described embodiments have been used where appropriate, with some construction differences being indicated with the suffix "f". FIG. 9 shows the annealing as leaving silicon nitride 18b at a thickness of no more than 10 Angstroms between TiSi$_x$N$_y$ 24 and elemental tungsten 20. TiSi$_x$N$_y$ 24 is directly against silicon nitride 18b and elemental tungsten 20 is directly against silicon nitride 18b. Any other attribute(s) or aspect(s) as shown and/or described herein with respect to other embodiments may be used.

Figure 10:
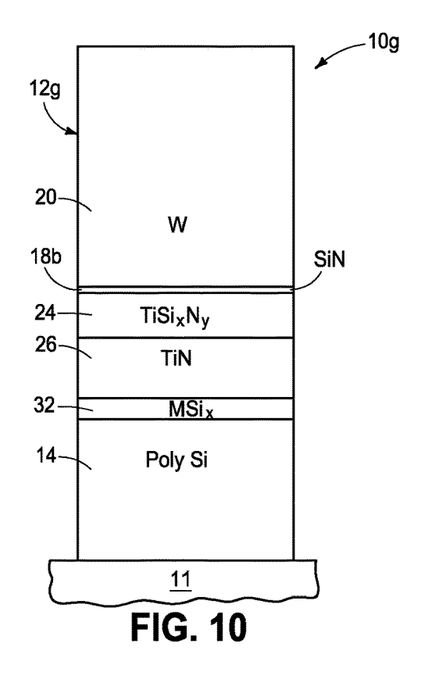
FIG. 10 is a view of the FIG. 6 substrate at a processing step subsequent to that shown by FIG. 6 and is an alternate to those shown by FIGS. 7-9.

An alternate example conductive line construction 10g is shown in FIG. 10. Like numerals from the above-described embodiments have been used where appropriate, with some construction differences being indicated with the suffix "g". FIG. 10 shows an alternate embodiment construction analogous to that of construction 10e of FIG. 8 and wherein the annealing leaves silicon nitride 18b at a thickness of no more than 10 Angstroms between TiSi$_x$N$_y$ 24 and elemental tungsten 20. Any other attribute(s) or aspect(s) as shown and/or described herein with respect to other embodiments may be used.

Embodiments of the invention encompass structures and/or devices independent of method of manufacture. Nevertheless, such structures and/or devices may have any of the attributes as described herein in method embodiments. Likewise, the above-described method embodiments may incorporate and form any of the attributes described with respect to structures and/or devices embodiments.

In one embodiment, a conductive line construction (e.g., 10, 10a, 10b, 10c, 10d, 10e, 10f, 10g) comprises polysilicon-comprising material (e.g., 14), a metal silicide (e.g., 22 and/or 32) directly against the polysilicon of the polysilicon-comprising material, elemental tungsten (e.g., 20), and TiSi$_x$N$_y$ (e.g., 24) between the elemental tungsten and the metal silicide. The conductive line construction comprises one of (a) or (b), where (a): the TiSi$_x$N$_y$ is directly against the metal silicide (e.g., FIGS. 2, 4, 7, 9) and (b): titanium nitride is between the TiSi$_x$N$_y$ and the metal silicide, with the TiSi$_x$N$_y$ being directly against the titanium nitride and the titanium nitride being directly against the metal silicide (e.g., FIGS. 3, 5, 8, 10). In one embodiment, the metal silicide comprises titanium silicide. In one embodiment, the metal silicide comprises at least one of nickel silicide, magnesium silicide, platinum silicide, tantalum silicide, cobalt silicide, tungsten silicide, and molybdenum silicide. In one embodiment, the metal silicide comprises at least two of nickel silicide, magnesium silicide, platinum silicide, tantalum silicide, cobalt silicide, tungsten silicide, and molybdenum silicide. In one embodiment, the metal silicide comprises at least two of titanium silicide, nickel silicide, magnesium silicide, platinum silicide, tantalum silicide, cobalt silicide, tungsten silicide, and molybdenum silicide. In one embodiment, the metal silicide has a thickness of 20 Angstroms to 70 Angstroms. Any other attribute(s) or aspect(s) as shown and/or described herein with respect to other embodiments may be used.

Figure 11:
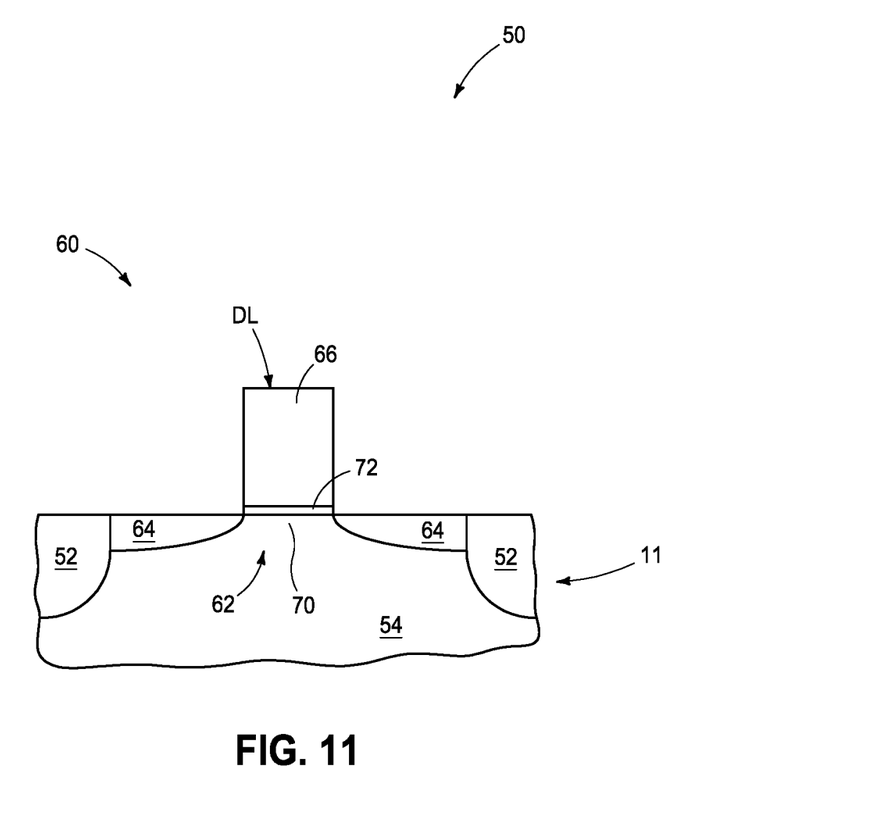
FIG. 11 is a view of memory circuitry in accordance with an embodiment of the invention.

An embodiment of the invention comprises memory circuitry, for example circuitry 50 shown in FIG. 11. Such by way of example only shows base substrate 11 as comprising suitably and variously doped semiconductive material 54, such as monocrystalline silicon having example dielectric isolation regions 52 formed therein. Such memory circuitry comprises an array of memory cells (not shown) and a periphery circuit 60 configured to access the array of memory cells. Periphery circuit 60 comprises a plurality of transistors including a transistor 62 that has a pair of source/drain regions 64 and a gate 66 comprising a digitline (or bitline) DL (e.g., running horizontally into and out of the plane upon which FIG. 11 lies). Transistor 62 comprises a channel region 70 between source/drain regions 64 and a gate insulator (e.g., gate dielectric material) 72 between gate 66 and channel region 70. Digitline DL (and thus gate 66) comprises structure as described above, namely a polysilicon-comprising material, a metal silicide directly against the polysilicon of the polysilicon-comprising material, elemental tungsten, TiSi$_x$N$_y$ between the elemental tungsten and the metal silicide, and at least one of (a) or (b), where, (a): the TiSi$_x$N$_y$ is directly against the metal silicide and (b): titanium nitride is between the TiSi$_x$N$_y$ and the metal silicide, with the TiSi$_x$N$_y$ being directly against the titanium nitride and the TiSi$_x$N$_y$ being directly against the metal silicide. In one embodiment, only one of the wordline and the digitline comprises, collectively, the polysilicon-comprising material, metal silicide, elemental tungsten, TiSi$_x$N$_y$, and one of (a) or (b), and in one embodiment each of the wordline and the digitline comprises, collectively, such polysilicon-comprising material, metal silicide, elemental tungsten, TiSi$_x$N$_y$, and one of (a) or (b). Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above acid/or below that shown in the figures or described above. Further, the array(s) of components may be the same or different relative one another in different stacks/decks. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated region s/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, "selective" as to etch, etching, removing, removal, depositing, forming, and/or formation is such an act of one stated material relative to another stated material(s) so acted upon at a rate of at least 2:1 by volume. Further, selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method of forming a conductive line construction comprises forming a structure comprising polysilicon-comprising material. Elemental titanium is directly against the polysilicon of the polysilicon-comprising material. Silicon nitride is directly against the elemental titanium. Elemental tungsten is directly against the silicon nitride. The structure is annealed to form a conductive line construction comprising the polysilicon-comprising material, titanium silicide directly against the polysilicon-comprising material, elemental tungsten, TiSi$_x$N$_y$ between the elemental tungsten and the titanium silicide, and one of (a) or (b), with (a) being the TiSi$_x$N$_y$ is directly against the titanium silicide, and (b) being titanium nitride is between the TiSi$_x$N$_y$ and the titanium silicide, with the TiSi$_x$N$_y$ being directly against the titanium nitride and the titanium nitride being directly against the titanium silicide.

In some embodiments, a method of forming a conductive line construction comprises forming a structure comprising polysilicon-comprising material. Elemental metal is directly against the polysilicon of the polysilicon-comprising material. Elemental titanium is directly against the elemental metal. Silicon nitride is directly against the elemental titanium. Elemental tungsten is directly against the silicon nitride. The structure is annealed to form a conductive line construction comprising the polysilicon-comprising material, metal silicide directly against the polysilicon-comprising material, with the metal silicide comprising elemental metal that reacts with the polysilicon of the polysilicon-comprising material to form said metal silicide, elemental tungsten, TiSi$_x$N$_y$ between the elemental tungsten and the metal silicide, and one of (a) or (b), with (a) being the TiSi$_x$N$_y$ is directly against the metal silicide, and (b) being titanium nitride is between the TiSi$_x$N$_y$ and the metal silicide, with the TiSi$_x$N$_y$ being directly against the titanium nitride and the titanium nitride being directly against the metal silicide.

In some embodiments, a method comprises forming a structure comprising polysilicon-comprising material, titanium-comprising material over the polysilicon-comprising material, silicon nitride-comprising material over the titanium-comprising material, and tungsten-comprising material over the silicon nitride-comprising material; and. The structure is annealed to cause at least a part of the silicon nitride to be converted into conductive material comprising titanium, silicon and nitrogen. In one embodiment, the polysilicon-comprising material consists essentially of (or consists of) polysilicon, the titanium-comprising material consists essentially of (or consists of) elemental titanium, the silicon nitride-comprising material consists essentially of (or consists of) silicon nitride, and the tungsten-comprising material consists essentially of (or consists of) elemental tungsten.

In some embodiments, a conductive line construction comprises polysilicon-comprising material, a metal silicide directly against the polysilicon of the polysilicon-comprising material, elemental tungsten, TiSi$_x$N$_y$ between the elemental tungsten and the metal silicide, and one of (a) or (b), with (a) being the TiSi$_x$N$_y$ is directly against the metal silicide, and (b) being titanium nitride is between the TiSi$_x$N$_y$ and the metal silicide, with the TiSi$_x$N$_y$ being directly against the titanium nitride and the titanium nitride being directly against the metal silicide.

In some embodiments, memory circuitry comprises an array of memory cells individually comprising a transistor having a pair of source/drain regions and a gate comprising a wordline. A storage element is electrically coupled to one of the source/drain regions and a digitline is electrically coupled to the other of the source/drain regions. At least one of the wordline and the digitline comprises polysilicon-comprising material, a metal silicide directly against the polysilicon of the polysilicon-comprising material, elemental tungsten, TiSi$_x$N$_y$ between the elemental tungsten and the metal silicide, and one of (a) or (b), with (a) being the TiSi$_x$N$_y$ is directly against the metal silicide, and (b) being titanium nitride is between the TiSi$_x$N$_y$ and the metal silicide, with the TiSi$_x$N$_y$ being directly against the titanium nitride and the titanium nitride being directly against the metal silicide.

In some embodiments, a semiconductor device comprises a memory array comprising at least one digit-line, at least one word-line, and at least one memory cell electrically coupled to the at least one digit-line and the at least one word-line. At least one peripheral transistor comprises a gate electrode and a pair of source/drain regions. The at least one digit-line comprises the gate electrode of the at least one peripheral transistor. The gate of the at least one peripheral transistor comprises polysilicon-comprising material, metal silicide-comprising material over the polysilicon-comprising material, composite material including titanium, silicon and nitrogen-comprising material, and tungsten-comprising material over the composite material. In one embodiment, the polysilicon-comprising material consists essentially of (or consists of) polysilicon; the metal silicide-comprising material consists essentially of (or consists of) metal silicide; the titanium, silicon and nitrogen-comprising material consists essentially of (or consists of) titanium, silicon and nitrogen; and the tungsten-comprising material consists essentially of (or consists of) elemental tungsten.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a conductive line construction, comprising:
   forming a structure comprising polysilicon-comprising material, elemental titanium directly against the polysilicon of the polysilicon-comprising material, silicon nitride directly against the elemental titanium, and elemental tungsten directly against the silicon nitride; and
   annealing the structure to form a conductive line construction comprising:
      the polysilicon-comprising material;
      titanium silicide directly against the polysilicon-comprising material;
      elemental tungsten;
      $TiSi_xN_y$ between the elemental tungsten and the titanium silicide; and
      one of (a) or (b), where,
         (a): the $TiSi_xN_y$ is directly against the titanium silicide;
         (b): titanium nitride is between the $TiSi_xN_y$ and the titanium silicide, the $TiSi_xN_y$ being directly against the titanium nitride, the titanium nitride being directly against the titanium silicide.

2. The method of claim 1 comprising forming the silicon nitride to be amorphous.

3. The method of claim 1 comprising forming all of the silicon nitride at a temperature of no greater than 350° C.

4. The method of claim 1 comprising:
   forming the polysilicon-comprising material, the elemental titanium, the silicon nitride, and the elemental tungsten over a substrate; and
   forming each of the elemental titanium, the silicon nitride, and the elemental tungsten over the substrate in sub-atmospheric conditions; the substrate being kept at sub-atmospheric conditions at all times between forming all of the elemental titanium and forming all of the elemental tungsten.

5. The method of claim 4 comprising forming the silicon nitride by physical vapor deposition at a temperature of no greater than 350° C.

6. The method of claim 1 wherein the annealing comprises a temperature of at least 800° C.

7. The method of claim 1 comprising forming the elemental titanium to a thickness of 15 Angstroms to 30 Angstroms.

8. The method of claim 1 comprising forming the silicon nitride to a thickness of 25 Angstroms to 40 Angstroms and forming the $TiSi_xN_y$ to a thickness of 20 Angstroms to 70 Angstroms.

9. The method of claim 1 wherein the annealing forms the $TiSi_xN_y$ directly against the elemental tungsten.

10. The method of claim 1 wherein the annealing leaves the silicon nitride at a thickness of no more than 10 Angstroms between the $TiSi_xN_y$ and the elemental tungsten, the $TiSi_xN_y$ being directly against the silicon nitride of thickness of no more than 10 Angstroms, the elemental tungsten being directly against the silicon nitride of thickness of no more than 10 Angstroms.

11. The method of claim 1 being (a).

12. The method of claim 11 only being the (a) of the (a) and the (b).

13. The method of claim 1 being (b).

14. The method of claim 13 only being the (b) of the (a) and the (b).

15. A method comprising:
   forming a structure comprising polysilicon-comprising material, titanium-comprising material over the polysilicon-comprising material, material consisting essentially of silicon nitride over the titanium-comprising material, and tungsten-comprising material over the material consisting essentially of silicon nitride; and
   annealing the structure to cause at least a part of the silicon nitride to be converted into conductive material comprising titanium, silicon and nitrogen.

16. A conductive line construction comprising:
   polysilicon-comprising material;
   a metal silicide directly against the polysilicon of the polysilicon-comprising material;
   elemental tungsten;
   $TiSi_xN_y$ between the elemental tungsten and the metal silicide; and
   titanium nitride being between the $TiSi_xN_y$ and the metal silicide, the $TiSi_xN_y$ being directly against the titanium nitride, the titanium nitride being directly against the metal silicide.

17. A method comprising:
   forming a structure comprising polysilicon-comprising material, titanium-comprising material over the polysilicon-comprising material, silicon nitride-comprising material over the titanium-comprising material, and tungsten-comprising material over the silicon nitride-comprising material, the silicon nitride-comprising material being in the structure as amorphous silicon nitride-comprising material; and
   annealing the structure to cause at least a part of the silicon nitride to be converted into conductive material comprising titanium, silicon and nitrogen.

18. A method comprising:
   forming a structure comprising polysilicon-comprising material, titanium-comprising material over the polysilicon-comprising material, silicon nitride-comprising material over the titanium-comprising material, and tungsten-comprising material over the silicon nitride-comprising material;
   the polysilicon-comprising material consists essentially of polysilicon, the titanium-comprising material consists essentially of elemental titanium, the silicon nitride-comprising material consists essentially of silicon nitride, and the tungsten-comprising material consists essentially of elemental tungsten; and
   annealing the structure to cause at least a part of the silicon nitride to be converted into conductive material comprising titanium, silicon and nitrogen.

19. A conductive line construction comprising:
   polysilicon-comprising material;
   a metal silicide directly against the polysilicon of the polysilicon-comprising material;
   elemental tungsten;
   $TiSi_xN_y$ between the elemental tungsten and the metal silicide;
   titanium nitride between the $TiSi_xN_y$ and the metal silicide, the $TiSi_xN_y$ being directly against the titanium nitride, the titanium nitride being directly against the metal silicide; and silicon nitride between the $TiSi_xN_y$ and the elemental tungsten, the silicon nitride being no thicker than 10 Angstroms, the elemental tungsten being directly against the silicon nitride, and the silicon nitride being directly against the $TiSi_xN_y$.

* * * * *